United States Patent
Zhan

(10) Patent No.: US 9,196,737 B2
(45) Date of Patent: Nov. 24, 2015

(54) THIN FILM SEMICONDUCTOR DEVICE, ORGANIC LIGHT-EMITTING DISPLAY DEVICE, AND METHOD OF MANUFACTURING THE THIN FILM SEMICONDUCTOR DEVICE

(71) Applicant: Samsung Display Co., Ltd., Yongin, Gyeonggi-Do (KR)

(72) Inventor: Zhi-Feng Zhan, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 13/944,084

(22) Filed: Jul. 17, 2013

(65) Prior Publication Data

US 2014/0225075 A1 Aug. 14, 2014

(30) Foreign Application Priority Data

Feb. 14, 2013 (KR) ........................ 10-2013-0016052

(51) Int. Cl.
  *H01L 29/786* (2006.01)
  *H01L 27/12* (2006.01)
  *H01L 27/32* (2006.01)

(52) U.S. Cl.
  CPC ...... *H01L 29/78672* (2013.01); *H01L 27/1255* (2013.01); *H01L 29/78621* (2013.01); *H01L 27/3262* (2013.01); *H01L 27/3265* (2013.01); *H01L 2227/323* (2013.01)

(58) Field of Classification Search
  CPC ................. H01L 27/1255; H01L 29/66757; H01L 29/78621; H01L 29/78624; H01L 29/78375; H01L 27/3244; H01L 27/78621; G02F 1/13454
  USPC .............. 257/59, 72, 296; 313/504, 506
  See application file for complete search history.

(56) References Cited

U.S. PATENT DOCUMENTS 6,576,924 B1 *  6/2003  Yamazaki et al. .............. 257/59
8,183,762 B2 *  5/2012  Kim et al. ..................... 313/504

FOREIGN PATENT DOCUMENTS

| KR | 1020060114459 A | 11/2006 |
| KR | 1020100076603 A | 7/2010 |
| KR | 1020120069457 A | 6/2012 |

\* cited by examiner

*Primary Examiner* — Kenneth Parker
*Assistant Examiner* — Bo Fan
(74) *Attorney, Agent, or Firm* — Robert E. Bushnell, Esq.

(57) ABSTRACT

Provided is a thin film semiconductor device such as an organic light-emitting display which includes a thin film transistor (TFT) having a lightly doped region. The thin film semiconductor includes a substrate, a first active pattern, a first lower conductive pattern, and a first upper conductive pattern. The first active pattern is disposed on the substrate and includes a channel region, a lightly doped region, and a heavily doped region. The first lower conductive pattern is disposed on the first active pattern and covers the channel region. The first upper conductive pattern is disposed on the first lower conductive pattern and covers the channel region and the lightly doped region.

20 Claims, 6 Drawing Sheets

THIN FILM SEMICONDUCTOR DEVICE, ORGANIC LIGHT-EMITTING DISPLAY DEVICE, AND METHOD OF MANUFACTURING THE THIN FILM SEMICONDUCTOR DEVICE

CLAIM OF PRIORITY

This U.S. non-provisional patent application claims priority under 35 U.S.C. §119 of Korean Patent Application No. 10-2013-0016052, filed on Feb. 14, 2013, the contents of which are hereby incorporated by reference in its entirety.

BACKGROUND OF THE INVENTION

1. Field of the Invention

Embodiments of the present invention generally relates to a thin film semiconductor device such as an organic light-emitting display device, and more particularly, to a thin film semiconductor device such as an organic light-emitting display which includes a thin film transistor (TFT) having improved electrical characteristics.

2. Description of the Related Art

Compared to a semiconductor device using a semiconductor substrate, when a thin film transistor (TFT) is formed by using a semiconductor thin film formed on a glass substrate, manufacturing costs may be reduced and a process for a large area may be easily performed, so that a thin film semiconductor device such as a flat panel display device is used in various fields.

An organic light-emitting display device is a self-emissive display apparatus that emits light and has characteristics of high brightness and a low operating voltage, so that the organic light-emitting display device has an excellent contrast ratio, can be formed as an ultra slim display apparatus, and is stable in realizing a moving picture at a response time of about several microseconds (μs). Also, the organic light-emitting display device does not have a limit in a viewing angle, is stable at low temperatures, and is driven with a low voltage of about 5 to 15 V (direct current (DC)), so that it is easy to manufacture and design a driving circuit for the organic light-emitting display device, and the manufacturing process is simple.

The organic light-emitting display device includes TFTs and a capacitor so as to control emission by pixels. For example, a TFT includes a semiconductor pattern formed of polysilicon. The semiconductor pattern includes a channel region and impurity regions that are doped with impurity at sides of the channel region. Since a doping density sharply changes at a boundary between the impurity region and the channel region, a strong electric field may be induced. The strong electric field causes a short channel effect or a hot electron effect, such that leakage current is increased and an off-current characteristic deteriorates.

SUMMARY OF THE INVENTION

The present invention provides a thin film semiconductor device such as an organic light-emitting display device, and a method of manufacturing the thin film semiconductor device, whereby an electrical characteristic such as an off-current characteristic of a thin film transistor (TFT) can be improved while a total number of mask processes is not increased.

According to an aspect of the present invention, there is provided a thin film semiconductor device including a substrate, a first active pattern, a first lower conductive pattern, and a first upper conductive pattern. The first active pattern is disposed on the substrate and includes a channel region, a lightly doped region, and a heavily doped region. The first lower conductive pattern is disposed on the first active pattern and covers the channel region. The first upper conductive pattern is disposed on the first lower conductive pattern and covers the channel region and the lightly doped region.

A boundary between the lightly doped region and the heavily doped region may correspond to an edge of the first upper conductive pattern. Also, a boundary between the channel region and the lightly doped region may correspond to an edge of the first lower conductive pattern.

The first active pattern and the first lower conductive pattern may configure a first thin film transistor (TFT), and the first lower conductive pattern may function as a gate electrode of the first TFT.

The first lower conductive pattern and the first upper conductive pattern may configure a capacitor.

The thin film semiconductor device may further include a lower gate insulating layer between the first active pattern and the first lower conductive pattern, and an upper gate insulating layer between the first lower conductive pattern and the first upper conductive pattern.

The heavily doped region may include a first heavily doped region and a second heavily doped region which are disposed at sides of the channel region. The lightly doped region may include a first lightly doped region between the channel region and the first heavily doped region, and a second lightly doped region between the channel region and the second heavily doped region.

The thin film semiconductor device may further include a second active pattern formed from the same layer as the first active pattern and including a source region, a drain region, and a channel region between the source region and the drain region, and a second lower conductive pattern formed from the same layer as the first lower conductive pattern and covering the channel region of the second active pattern. The second active pattern and the second lower conductive pattern may configure a second TFT. The second lower conductive pattern may function as a gate electrode of the second TFT.

The second active pattern may further include a lightly doped region between the channel region and one of the source region and the drain region. The thin film semiconductor device may include a second upper conductive pattern formed from the same layer as the first upper conductive pattern and covering the channel region and the lightly doped region of the second active pattern.

The second upper conductive pattern may be electrically connected to the second lower conductive pattern and thus may function as a common gate electrode of the second TFT.

The second upper conductive pattern may float.

According to another aspect of the present invention, there is provided an organic light-emitting display device including a substrate, a plurality of thin film transistors (TFTs) and a capacitor on the substrate, a pixel electrode electrically connected to one of the plurality of TFTs, a common electrode on the pixel electrode, and an intermediate layer disposed between the pixel electrode and the common electrode and including an emission layer (EML). A first TFT that is one of the plurality of TFTs includes a first active pattern including a channel region, a lightly doped region, and a heavily doped region, and a first lower conductive pattern disposed on the first active pattern and covering the channel region. The capacitor includes the first lower conductive pattern, and a first upper conductive pattern that is disposed on the first lower conductive pattern and that covers the channel region and the lightly doped region.

A boundary between the lightly doped region and the heavily doped region may be positioned in correspondence to an edge of the first upper conductive pattern. A boundary between the channel region and the lightly doped region may be positioned in correspondence to an edge of the first lower conductive pattern.

The first lower conductive pattern may function as a gate electrode of the first TFT and a lower electrode of the capacitor.

The heavily doped region may include a source region and a drain region which are disposed at sides of the channel region. Also, the lightly doped region may include a low-density source region between the channel region and the source region, and a low-density drain region between the channel region and the drain region.

The first TFT may be a driving TFT that supplies driving current to the EML.

A second TFT that is one of the plurality of TFTs may include a second active pattern that is formed from the same layer as the first active pattern and that includes a source region, a drain region, and a channel region between the source region and the drain region, and a second lower conductive pattern that is formed from the same layer as the first lower conductive pattern, that covers the channel region of the second active pattern, and that functions as a gate electrode of the second TFT.

The second active pattern may further include a lightly doped region between the channel region and one of the source region and the drain region. The organic light-emitting display device may include a second upper conductive pattern formed from the same layer as the first upper conductive pattern and covering the channel region and the lightly doped region of the second active pattern.

According to another aspect of the present invention, there is provided a method of manufacturing a thin film semiconductor device, the method including operations of forming an active pattern on a substrate, forming a lower conductive pattern on the active pattern, lightly injecting impurities into the active pattern by using the lower conductive pattern as a doping mask, forming an upper conductive pattern on the lower conductive pattern, and heavily injecting impurities into the active pattern by using the lower conductive pattern and the upper conductive pattern as doping masks, thus forming the active pattern including a channel region, a lightly doped region, and a heavily doped region.

The lower conductive pattern may cover the channel region and may not cover the lightly doped region and the heavily doped region. Also, the upper conductive pattern may cover the channel region and the lightly doped region, and may not cover the heavily doped region.

The operation of forming the lower conductive pattern may include operations of forming a lower gate insulating layer on the active pattern, and forming the lower conductive pattern on the lower gate insulating layer. Also, the operation of forming the upper conductive pattern may include operations of forming an upper gate insulating layer on the lower conductive pattern, and forming the upper conductive pattern on the upper gate insulating layer.

The active pattern and the lower conductive pattern may configure a thin film transistor (TFT). The lower conductive pattern and the upper conductive pattern may configure a capacitor. The lower conductive pattern may function as a gate electrode of the TFT and a lower electrode of the capacitor.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
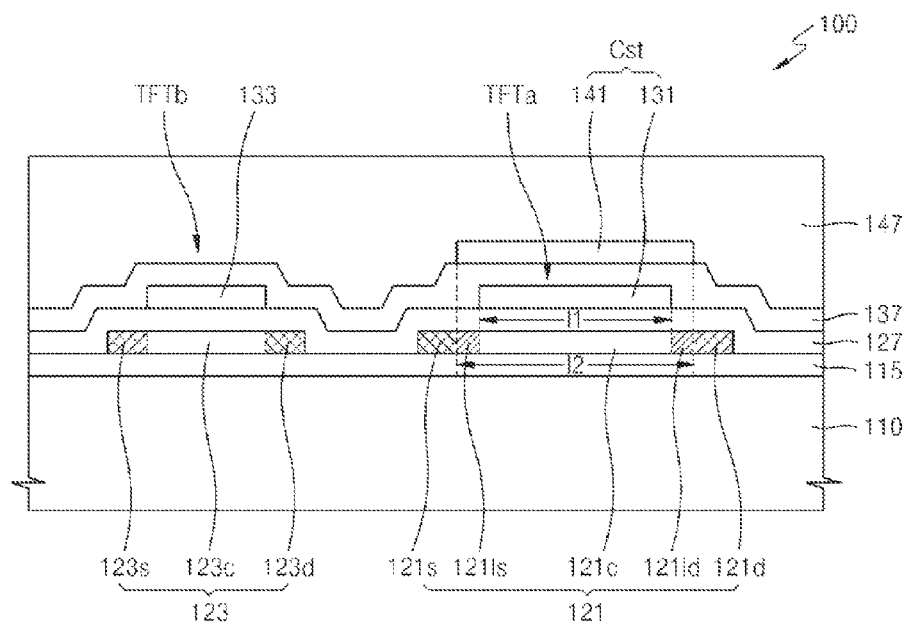
FIG. 1 is a cross-sectional view illustrating a thin film semiconductor device constructed as an embodiment according to the principles of the present invention.

The present invention will now be described more fully with reference to the accompanying drawings, in which exemplary embodiments of the invention are shown. The invention may, however, be embodied in many different forms, and should not be construed as being limited to the embodiments set forth herein. Thus, the invention may include all revisions, equivalents, or substitutions which are included in the concept and the technical scope related to the invention.

Like reference numerals in the drawings denote like elements. In the drawings, the dimension of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof. As used herein, the term "and/or" includes any and all combinations of one or more of the associated listed items. Throughout the specification, while terms "first" and "second" are used to describe various components, it is obvious that the components are not limited to the terms "first" and "second". The terms "first" and "second" are used only to distinguish between each component. As used herein, it will also be understood that when a first feature is referred to as being "connected to", "combined with", or "interfaced with" a second feature, intervening third features may also be present. Also, throughout the specification, it will also be understood that when an element such as layer, region, or substrate is referred to as being "on", "connected to" or "coupled with" another element, it can be directly on the other element, or intervening elements may also be present. However, when an element is referred to as being "directly on", "directly connected to" or "directly coupled with" another element, it will be understood that there are no intervening elements.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

FIG. 1 is a cross-sectional view illustrating a thin film semiconductor device 100 constructed as an embodiment according to the principles of the present invention.

Referring to FIG. 1, the thin film semiconductor device 100 includes a substrate 110 and a first thin film transistor (TFT) TFTa on the substrate 110. The thin film semiconductor device 100 may further include a capacitor Cst on the first TFT TFTa. The thin film semiconductor device 100 may further include a second TFT TFTb. The thin film semiconductor device 100 indicates all devices that include the first TFT TFTa. For example, the thin film semiconductor device 100 may be a flat panel display device such as an organic light-emitting display device, a liquid crystal display device, or the like.

The substrate 110 may be an insulating substrate formed of a transparent glass material containing $SiO_2$ as a main constituent or a transparent plastic material. The substrate 110 may be a conductive substrate formed of a thin film metal material. The substrate 110 may be a flexible substrate or a rigid substrate.

A buffer layer 115 may be disposed on the substrate 110 so as to prevent diffusion of impurity ions or penetration of exterior air and to provide a planarized surface. The first and second TFTs TFTa and TFTb may be disposed on the buffer layer 115.

The first TFT TFTa includes a first active pattern 121 in which a channel is formed, a first lower conductive pattern 131 to which an electric field is applied to allow the channel to be formed, and a lower gate insulating layer 127 that is interposed between the first active pattern 121 and the first lower conductive pattern 131.

The first active pattern 121 includes a channel region 121c in which the channel is formed, and a source region 121s and a drain region 121d that are respectively disposed at opposite sides of the channel region 121c. The first active pattern 121 further includes a low-density source region 121ls between the channel region 121c and the source region 121s, and a low-density drain region 121ld between the channel region 121c and the drain region 121d. A channel length of the channel region 121c that is defined by the low-density source region 121ls and the low-density drain region 121ld may be a first length l1, and a length of the low-density source region 121ls, the channel region 121c, and the low-density drain region 121ld that are defined by the source region 121s and the drain region 121d may be a second length l2.

The low-density source region 121ls and the low-density drain region 121ld have a doping density that is lower than an impurity doping density of the source region 121s and the drain region 121d. In this regard, the low-density source region 121ls and the low-density drain region 121ld may be collectively referred as a lightly doped region. Also, since the source region 121s and the drain region 121d have an impurity doping density higher than the doping density of the lightly doped region, the source region 121s and the drain region 121d may be collectively referred as a heavily doped region.

In the embodiment of FIG. 1, the low-density source region 121ls and the low-density drain region 121ld are disposed between the channel region 121c and the source region 121s and between the channel region 121c and the drain region 121d, respectively; however, in other embodiments of the present invention, only one of the low-density source region 121ls and the low-density drain region 121ld may be arranged. For example, the low-density source region 121ls may be omitted and only the low-density drain region 121ld may be disposed.

The first lower conductive pattern 131 may function as a gate electrode of the first TFT TFTa. A width of the first lower conductive pattern 131 in a channel length direction may correspond to the first length l1 that is the channel length of the channel region 121c. Both edges of the first lower conductive pattern 131 in the channel length direction may define the channel length of the channel region 121c. That is, a boundary between the low-density source region 121ls and the channel region 121c, and a boundary between the low-density drain region 121ld and the channel region 121c may be defined by the edges of the first lower conductive pattern 131.

A first upper conductive pattern 141 may be disposed on the first lower conductive pattern 131. An upper gate insulating layer 137 may be disposed between the first lower conductive pattern 131 and the first upper conductive pattern 141. The first upper conductive pattern 141 and the first lower conductive pattern 131 may configure the capacitor Cst. The upper gate insulating layer 137 may function as a dielectric layer of the capacitor Cst, and the first upper conductive pattern 141 and the first lower conductive pattern 131 may function as an upper electrode and a lower electrode of the capacitor Cst, respectively. As described above, the first lower conductive pattern 131 may simultaneously function as the lower electrode of the capacitor Cst and the gate electrode of the first TFT TFTa.

As illustrated in FIG. 1, the first upper conductive pattern 141 may have a width l2 that is greater than the width of the first lower conductive pattern 131. The first upper conductive pattern 141 may define the boundary between the low-density source region 121ls and the source region 121s, and the boundary between the low-density drain region 121ld and the drain region 121d. That is, the second length l2 that is the length of the low-density source region 121ls, the channel region 121c, and the low-density drain region 121ld in the channel length direction may be defined by the width l2 of the first upper conductive pattern 141.

The second TFT TFTb includes a second active pattern 123 in which a channel is formed, a second lower conductive pattern 133 to which an electric field is applied to allow the channel to be formed, and the lower gate insulating layer 127 that is interposed between the second active pattern 123 and the second lower conductive pattern 133. The second active pattern 123 may be formed from the same material layer as the first active pattern 121. Also, the second lower conductive pattern 133 may be formed from the same material layer as the first lower conductive pattern 131.

The second active pattern 123 includes a channel region 123c in which the channel is formed, and a source region 123s and a drain region 123d that are respectively disposed at opposite sides of the channel region 123c. The second lower conductive pattern 133 may be disposed on the channel region 123c. A channel length of the channel region 123c that is defined by the source region 123s and the drain region 123d may be determined by a width of the second lower conductive pattern 133. The second lower conductive pattern 133 may function as a gate electrode of the second TFT TFTb.

An interlayer insulating layer 147 may be disposed on the upper gate insulating layer 137 and the first upper conductive pattern 141. Although not illustrated in FIG. 1, electrode patterns that function as wires may be disposed on the interlayer insulating layer 147, and may be electrically connected to the first and second TFTs TFTa and TFTb and the capacitor Cst via contact plugs that penetrate through the interlayer insulating layer 147. The electrode patterns may be the wires that are connected to a source electrode that is connected to the source regions 121s and 123s; a drain electrode that is connected to the drain electrodes 121d and 123d; a gate wire that is connected to the first and second lower conductive patterns 131 and 133; and a wire that is connected to the first upper conductive pattern 141.

Although not illustrated in FIG. 1, the thin film semiconductor device 100 may further include a TFT that uses both the lower gate insulating layer 127 and the upper gate insulating layer 137 as a gate insulating layer. The TFT may include an active pattern formed from the same layer as the first and second active patterns 121 and 123, and a gate electrode formed from the same layer as the first upper conductive pattern 141. Here, only the lower gate insulating layer 127 and the upper gate insulating layer 137 may be disposed between the active pattern and the gate electrode. A channel of the TFT is formed by applying a higher voltage to the gate electrode, compared to the first and second TFTs TFTa and TFTb that use only the lower gate insulating layer 127 as a gate insulating layer, so that the TFT is advantageous in its broad operational range.

Figure 2A:
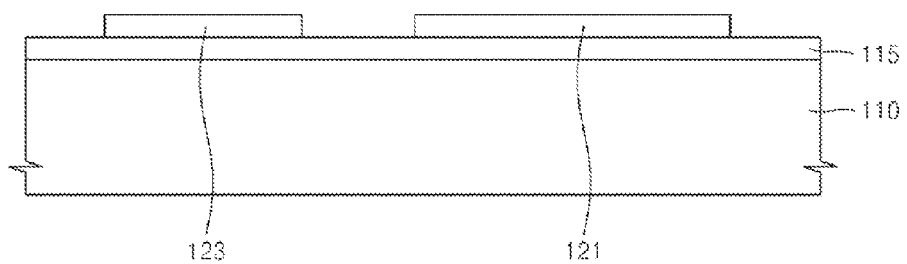
FIGS. 2A through 2C are cross-sectional views showing a method of manufacturing the thin film semiconductor device of FIG. 1, according to an embodiment of the present invention.
Figure 2B:
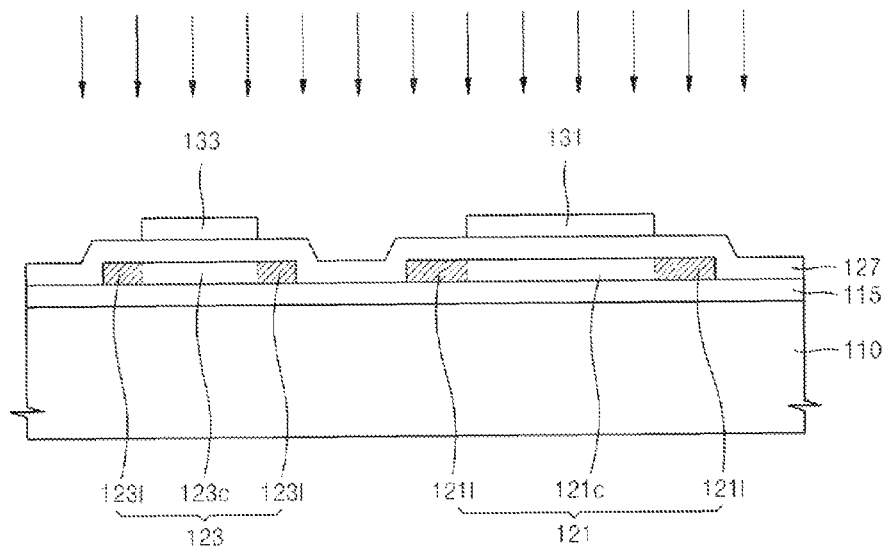
Figure 2C:
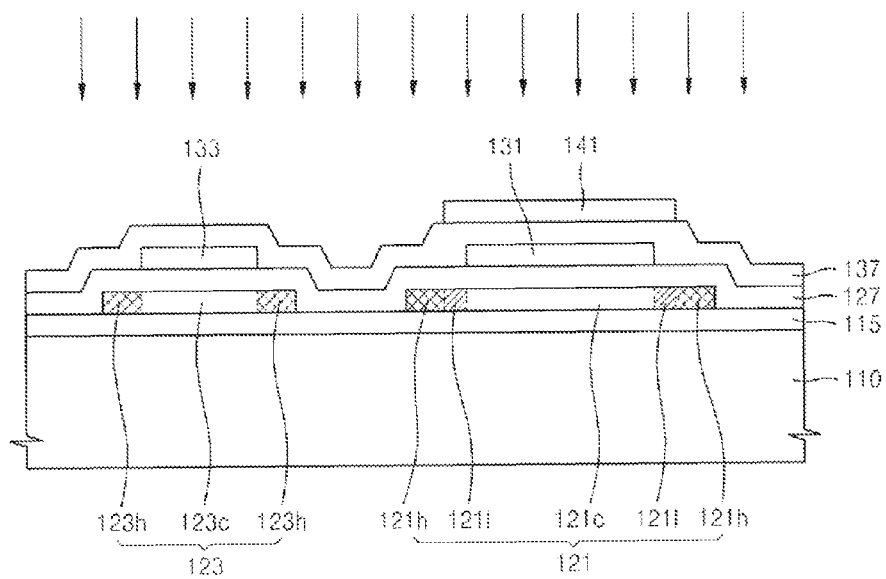

FIGS. 2A through 2C are cross-sectional views showing a method of manufacturing the thin film semiconductor device 100 of FIG. 1, according to an embodiment of the present invention.

Referring to FIG. 2A, the substrate 110, the buffer layer 115 on the substrate 110, and the first and second active patterns 121 and 123 on the buffer layer 115 are arranged.

The substrate 110 may be formed of a transparent glass material containing SiO2 as a main constituent. However, a material of the substrate 110 is not limited thereto and thus the substrate 110 may be formed of a transparent plastic material. Here, the transparent plastic material that forms the substrate 110 may include one or more materials selected from among various organic materials.

The buffer layer 115 may be formed on the substrate 110. The buffer layer 115 may include an inorganic insulating material such as silicon oxide, silicon nitride, silicon oxynitride, aluminum oxide, aluminum nitride, titanium oxide, or titanium nitride. The buffer layer 115 may include an organic insulating material such as polyimide, polyester, acryl, or the like and may be formed as a stack including the aforementioned materials or including the organic insulating material and the inorganic insulating material. Since the buffer layer 115 is not an essential element, the buffer layer 115 may be omitted according to a process condition.

The first and second active patterns 121 and 123 may be formed on the buffer layer 115. In more detail, a semiconductor material layer (not shown), e.g., an amorphous silicon layer, is first deposited on the buffer layer 115 and then is crystallized into a polysilicon layer (not shown). The amorphous silicon may be crystallized by using various methods including a rapid thermal annealing (RTA) method, a solid phase crystallization (SPC) method, an excimer laser annealing (ELA) method, a metal-induced crystallization (MIC) method, a metal-induced lateral crystallization (MILC) method, a sequential lateral solidification (SLS) method, and the like. The polysilicon layer may be patterned into the first and second active patterns 121 and 123 via a photolithography process using a first mask (not shown).

Referring to FIG. 2A, the first and second active patterns 121 and 123 are separated from each other. However, portions of the first and second active patterns 121 and 123, which are not shown in FIG. 2A, may be connected to each other. Also, in another embodiment, the first and second active patterns 121 and 123 that are formed of polysilicon may be formed in a manner that an amorphous silicon layer is first patterned and then is crystallized.

The first and second active patterns 121 and 123 may be formed as a silicon-based element semiconductor, but in other embodiments, the first and second active patterns 121 and 123 may be formed as a compound semiconductor, e.g., an oxide semiconductor or an organic semiconductor.

FIG. 2B illustrates the lower gate insulating layer 127 that covers the first and second active patterns 121 and 123, and the first and second lower conductive patterns 131 and 133. The first and second active patterns 121 and 123 may be divided into the channel regions 121c and 123c and lightly doped regions 121l and 123l, respectively.

The lower gate insulating layer 127 may be formed on the buffer layer 115 so as to cover the first and second active patterns 121 and 123. The lower gate insulating layer 127 may be formed of oxide, nitride, oxynitride, or a composition thereof.

The first and second lower conductive patterns 131 and 133, which overlap with the channel regions 121c and 123c of the first and second active patterns 121 and 123, respectively, may be formed on the lower gate insulating layer 127. In more detail, a first conductive layer (not shown) may be stacked on the lower gate insulating layer 127 and then may be patterned into the first and second lower conductive patterns 131 and 133 via a photolithography process and an etching process which use a second mask (not shown).

An ion implantation process may be performed by using the first and second lower conductive patterns 131 and 133 as a doping mask. Impurity ions with low density may be injected into portions of the first and second active patterns 121 and 123 that are not covered by the first and second lower conductive patterns 131 and 133. As a result, the lightly doped regions 121l and 123l are formed on the portions of the first and second active patterns 121 and 123 which are not covered by the first and second lower conductive patterns 131 and 133, and the channel regions 121c and 123c, to which the impurity ions are not injected, are formed on portions of the first and second active patterns 121 and 123 that are covered by the first and second lower conductive patterns 131 and 133.

FIG. 2C illustrates the upper gate insulating layer 137 that covers the first and second lower conductive patterns 131 and 133, and the first upper conductive pattern 141. The first active pattern 121 may be divided into the channel region 121c and the lightly doped regions 121l.

The upper gate insulating layer 137 may be formed on the lower gate insulating layer 127 so as to cover the first and second lower conductive patterns 131 and 133. The upper gate insulating layer 137 may be formed of oxide, nitride, oxynitride, or a composition thereof. The upper gate insulating layer 137 may be formed of the same material as the lower gate insulating layer 127, but in another embodiment, the upper gate insulating layer 137 may be formed of a different material from the lower gate insulating layer 127.

The first upper conductive pattern 141 that overlaps with the channel region 121c and the lightly doped regions 121l of the first active pattern 121 may be formed on the upper gate insulating layer 137. In more detail, a second conductive layer (not shown) may be stacked on the upper gate insulating layer 137 and may be patterned into the first upper conductive pattern 141 via a photolithography process and an etching process which use a third mask (not shown).

An ion implantation process may be performed by using the first and second lower conductive patterns 131 and 133 and the first upper conductive pattern 141 as doping masks. Impurity ions with high density may be injected into portions of the first and second active patterns 121 and 123 which are not covered by the first and second lower conductive patterns 131 and 133 and the first upper conductive pattern 141. As a result, portions of the first and second active patterns 121 and 123 that are covered by the first and second lower conductive patterns 131 and 133 are formed as the channel regions 121$c$ and 123$c$; portions of the first and second active patterns 121 and 123 that are not covered by the first and second lower conductive patterns 131 and 133 but are covered by the first upper conductive pattern 141 are formed as the lightly doped regions 121$l$; and portions of the first and second active patterns 121 and 123 that are not covered by the first and second lower conductive patterns 131 and 133 and the first upper conductive pattern 141 are formed as heavily doped regions 121$h$ and 123$h$.

Referring back to FIG. 1, the heavily doped regions 121$h$ of the first active pattern 121 become the source region 121$s$ and the drain region 121$d$, and the lightly doped regions 121$l$ of the first active pattern 121 become the low-density source region 121$ls$ and the low-density drain region 121$ld$. Similarly, the heavily doped regions 123$h$ of the second active pattern 123 become the source region 123$s$ and the drain region 123$d$.

Afterward, the interlayer insulating layer 147 of FIG. 1 may be formed on the upper gate insulating layer 137 so as to cover the first upper conductive pattern 141.

Figure 3A:
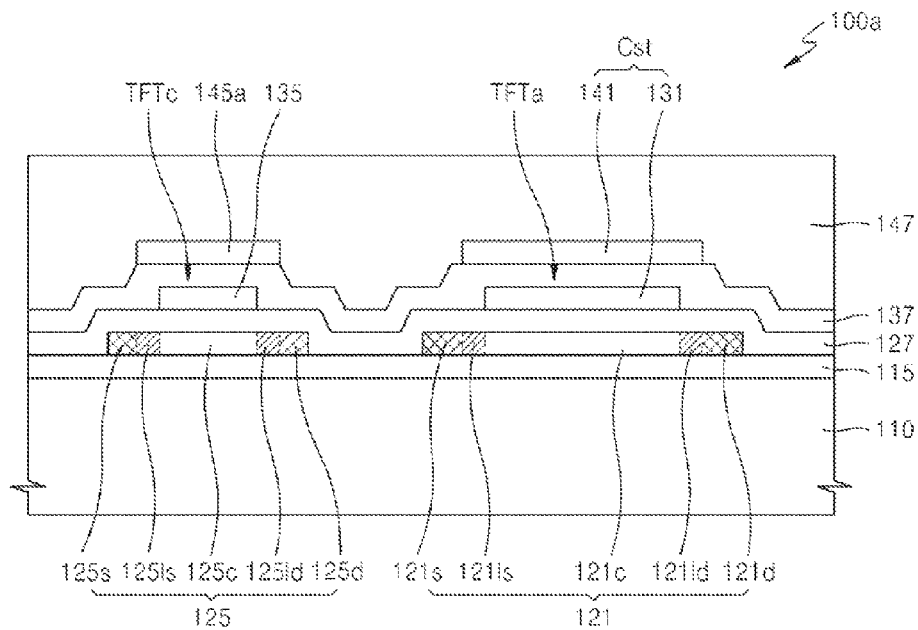
FIG. 3A is a cross-sectional view of a thin film semiconductor device constructed as another embodiment according to the principles of the present invention.

FIG. 3A is a cross-sectional view of a thin film semiconductor device 100$a$ constructed as another embodiment according to the principles of the present invention.

Referring to FIG. 3A, the thin film semiconductor device 100$a$ may include not only a first TFT TFTa and a capacitor Cst on the first TFT TFTa but may also include a third TFT TFTc. The thin film semiconductor device 100$a$ is substantially the same as the thin film semiconductor device 100 of FIG. 1 except that the thin film semiconductor device 100$a$ includes the third TFT TFTc. Thus, the present embodiment will be described in terms of features different from those of the previous embodiment. Referring to FIG. 3A, the third TFT TFTc replaces the second TFT TFTb of FIG. 1. However, the present embodiment is not limited thereto and thus the thin film semiconductor device 100$a$ may include both the second TFT TFTb and the third TFT TFTc.

The third TFT TFTc includes a third active pattern 125 in which a channel is formed, a third lower conductive pattern 135 that functions as a gate electrode of the third TFT TFTc, and the lower gate insulating layer 127 that is interposed between the third active pattern 125 and the third lower conductive pattern 135.

Similar to the first active pattern 121, the third active pattern 125 may include a source region 125$s$, a low-density source region 125$ls$, a channel region 125$c$, a low-density drain region 125$ld$, and a drain region 125$d$, which are sequentially formed. Referring to FIG. 3A, the low-density source region 125$ls$ and the low-density drain region 125$ld$ are disposed between the channel region 125$c$ and the source region 125$s$ and between the channel region 125$c$ and the drain region 125$d$, respectively. However, according to other embodiments of the present invention, only one of the low-density source region 125$ls$ and the low-density drain region 125$ld$ may be disposed. For example, only the low-density drain region 125$ld$ may be disposed, and the source region 125$s$ may be disposed adjacent to the channel region 125$c$ instead of the low-density source region 125$ls$.

The third lower conductive pattern 135, the upper gate insulating layer 137, and a second upper conductive pattern 145$a$ may be sequentially stacked on the third active pattern 125. At least one portion of the third lower conductive pattern 135 may overlap with the channel region 125$c$ of the third active pattern 125. The third lower conductive pattern 135 does not overlap with the source region 125$s$, the low-density source region 125$ls$, the low-density drain region 125$ld$, and the drain region 125$d$ of the third active pattern 125.

At least one portion of the second upper conductive pattern 145$a$ may overlap with the low-density source region 125$ls$, the channel region 125$c$, and the low-density drain region 125$ld$ of the third active pattern 125. The second upper conductive pattern 145$a$ does not overlap with the source region 125$s$ and the drain region 125$d$ of the third active pattern 125.

Thus, a boundary between the low-density source region 125$ls$ and the channel region 125$c$, and a boundary between the channel region 125$c$ and the low-density drain region 125$ld$ are defined in correspondence to edges of the third lower conductive pattern 135. Also, a boundary between the source region 125$s$ and the low-density source region 125$ls$, and a boundary between the low-density drain region 125$ld$ and the drain region 125$d$ are defined in correspondence to edges of the second upper conductive pattern 145$a$.

The third lower conductive pattern 135 and the second upper conductive pattern 145$a$ may also configure a capacitor. However, unless there is a demand for a circuit configuration in which a gate electrode of the third TFT TFTc is connected to the capacitor, the capacitance formed between the third lower conductive pattern 135 and the second upper conductive pattern 145$a$ may exist as a parasitic capacitance that causes a delay. In order to prevent this problem, the second upper conductive pattern 145$a$ may be directly and electrically connected to the third lower conductive pattern 135, thereby functioning as a common gate electrode of the third TFT TFTc. In another embodiment, the second upper conductive pattern 145$a$ may float so as to decrease the parasitic capacitance that is formed between the third lower conductive pattern 135 and the second upper conductive pattern 145$a$.

Figure 3B:
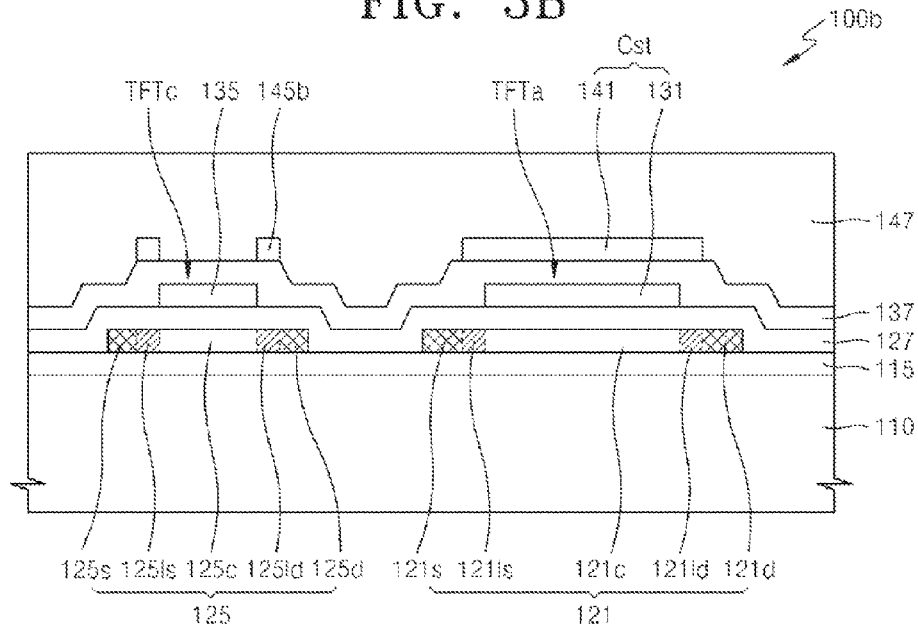
FIG. 3B is a cross-sectional view of a thin film semiconductor device constructed as another embodiment according to the principles of the present invention.

FIG. 3B is a cross-sectional view of a thin film semiconductor device 100$b$ constructed as another embodiment according to the principles of the present invention.

Referring to FIG. 3B, the thin film semiconductor device 100$b$ may include not only the first TFT TFTa, the capacitor Cst, and the third TFT TFTc but may also include a third upper conductive pattern 145$b$ on the third TFT TFTc. Except that the thin film semiconductor device 100$b$ includes the third upper conductive pattern 145$b$, instead of the second upper conductive pattern 145$a$, the thin film semiconductor device 100$b$ is substantially the same as the thin film semiconductor device 100$a$ of FIG. 3A. Thus, the present embodiment will be described in terms of features different from those of the previous embodiment.

The third upper conductive pattern 145$b$ overlaps with the low-density source region 125$ls$ and the low-density drain region 125$ld$ of the third active pattern. The third upper conductive pattern 145$b$ does not overlap with the source region 125$s$ and the drain region 125$d$ of the third active pattern 125. The third upper conductive pattern 145$b$ may not overlap with the channel region 125$c$ of the third active pattern 125. In another embodiment, the third upper conductive pattern 145b may partially overlap with the channel region 125c of the third active pattern 125.

Since the third upper conductive pattern 145b does not overlap with the third lower conductive pattern 135, the parasitic capacitance between the third lower conductive pattern 135 and the second upper conductive pattern 145a may be minimized.

Figure 4:
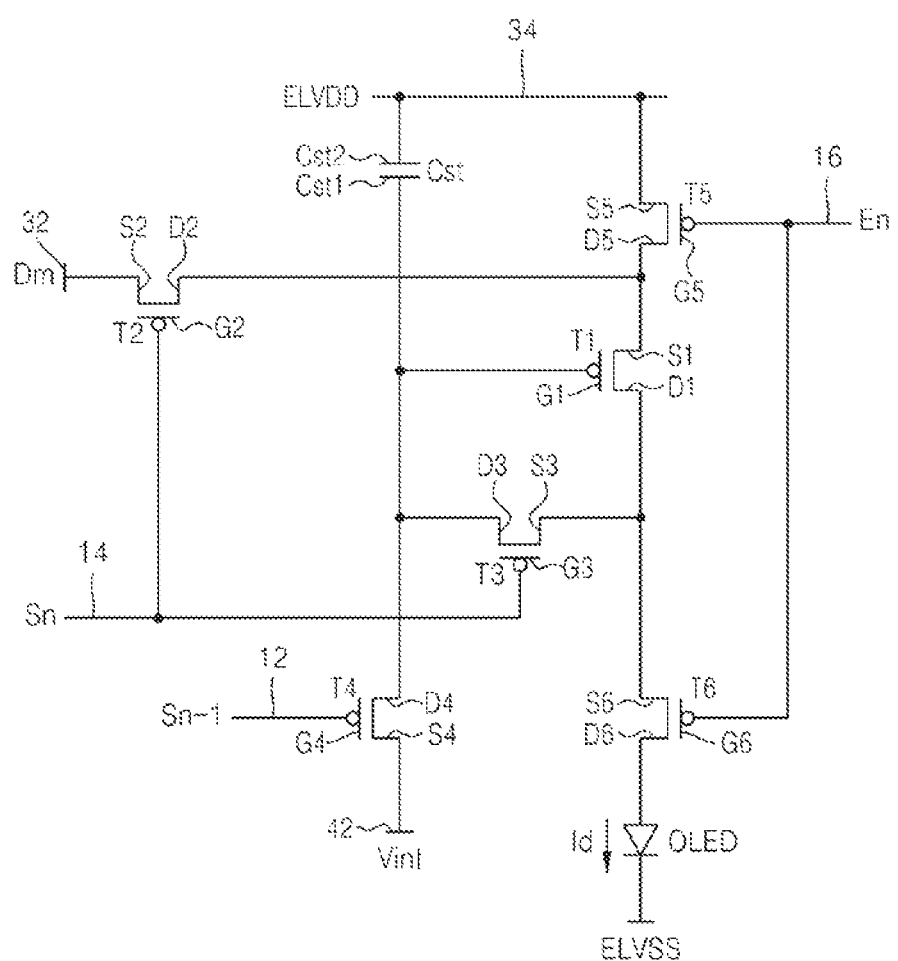
FIG. 4 is an equivalent circuit diagram illustrating one pixel of an organic light-emitting display device, according to an embodiment of the present invention.

FIG. 4 is an equivalent circuit diagram illustrating one pixel of an organic light-emitting display device, according to an embodiment of the present invention.

As illustrated in FIG. 4, one pixel of the organic light-emitting display device includes a plurality of signal lines 12, 14, 16, 32, 34, and 42, and a pixel circuit that is connected to the plurality of signal lines 12, 14, 16, 32, 34, and 42 and that includes a plurality of TFTs T1, T2, T3, T4, T5, and T6, and a storage capacitor Cst. Also, the pixel includes an organic light-emitting diode (OLED) that receives driving current via the pixel circuit and thus emits light.

The plurality of TFTs T1, T2, T3, T4, T5, and T6 may include a driving TFT T1, a switching TFT T2, a compensation TFT T3, an initialization TFT T4, an operation control TFT T5, and an emission control TFT T6.

The plurality of signal lines 12, 14, 16, 32, 34, and 42 may include a previous scan line 12 for transmitting a previous scan signal Sn−1 to the initialization TFT T4, a scan line 14 for transmitting a scan signal Sn, an emission control line 16 for transmitting an emission control signal En to the operation control TFT T5 and the emission control TFT T6, a data line 32 crossing the scan line 14 and for transmitting a data signal Dm, a driving voltage line 34 for transmitting a driving voltage ELVDD and extending in parallel with the data line 32, and an initialization voltage line 42 for transmitting an initialization voltage Vint to initialize the driving TFT T1.

A gate G1 of the driving TFT T1 is connected to an electrode Cst1 of the storage capacitor Cst. A source S1 of the driving TFT T1 is connected to the driving voltage line 34 via the operation control TFT T5. A drain D1 of the driving TFT T1 is electrically connected to an anode of the OLED via the emission control TFT T6. The driving TFT T1 receives the data signal Dm according to a switching operation of the switching TFT T2 and supplies driving current Id to the OLED.

A gate G2 of the switching TFT T2 is connected to the scan line 14, and a source S2 of the switching TFT T2 is connected the data line 32. A drain D2 of the switching TFT T2 is connected to the source S1 of the driving TFT T1 and to the driving voltage line 34 via the operation control TFT T5. The switching TFT T2 is turned on in response to the scan signal Sn that is transmitted via the scan line 14, and then transmits the data signal Dm, which is transmitted via the data line 32, to the source S1 of the driving TFT T1.

A gate G3 of the compensation TFT T3 is connected to the scan line 14. A source S3 of the compensation TFT T3 is connected to the drain D1 of the driving TFT T1 and to the anode of the OLED via the emission control TFT T6. A drain D3 of the compensation TFT T3 is commonly connected to the electrode Cst1 of the storage capacitor Cst, a drain D4 of the initialization TFT T4, and the gate G1 of the driving TFT T1. The compensation TFT T3 is turned on in response to the scan signal Sn that is transmitted via the scan line 14, and then diode-connects the driving TFT T1 by connecting the gate G1 and the drain D1 of the driving TFT T1.

A gate G4 of the initialization TFT T4 is connected to the previous scan line 12, and a source S4 of the initialization TFT T4 is connected to the initialization voltage line 42. The drain D4 of the initialization TFT T4 is commonly connected to the electrode Cst1 of the storage capacitor Cst, the drain D3 of the compensation TFT T3, and the gate G1 of the driving TFT T1. The initialization TFT T4 performs an initialization operation in which the initialization TFT T4 is turned on in response to the previous scan signal Sn−1 that is transmitted via the previous scan line 12, and then transmits the initialization voltage Vint to the gate G1 of the driving TFT T1 and thus initializes a voltage of the gate G1 of the driving TFT T1.

A gate G5 of the operation control TFT T5 is connected to the emission control line 16, a source S5 of the operation control TFT T5 is connected to the driving voltage line 34, and a drain D5 of the operation control TFT T5 is commonly connected to the source S1 of the driving TFT T1 and the drain D2 of the switching TFT T2.

A gate G6 of the emission control TFT T6 is connected to the emission control line 16, and a source S6 of the emission control TFT T6 is commonly connected to the drain D1 of the driving TFT T1 and the source S3 of the compensation TFT T3. A drain D6 of the emission control TFT T6 is connected to the anode of the OLED. The operation control TFT T5 and the emission control TFT T6 are simultaneously turned on in response to the emission control signal En that is transmitted via the emission control line 16, so that the driving current Id flows in the OLED.

The other electrode Cst2 of the storage capacitor Cst is connected to the driving voltage line 34. The electrode Cst1 of the storage capacitor Cst is commonly connected to the gate G1 of the driving TFT T1, the drain D3 of the compensation TFT T3, and the drain D4 of the initialization TFT T4.

A common voltage ELVSS is applied to a cathode of the OLED. The OLED emits light by receiving the driving current Id from the driving TFT T1, and thus displays an image.

Hereinafter, an operation procedure of the pixel of the organic light-emitting display device shown in FIG. 4 will be described in detail.

First, during an initialization period, the previous scan signal Sn−1 at a low level is supplied via the previous scan line 12. Then, the initialization TFT T4 is turned on in response to the previous scan signal Sn−1 at a low level, the initialization voltage Vint from the initialization voltage line 42 is applied to the gate G1 of the driving TFT T1 via the initialization TFT T4, and the driving TFT T1 is initialized due to the initialization voltage Vint.

Afterward, the scan signal Sn at a low level is supplied via the scan line 14 during a data programming period. Thus, the switching TFT T2 and the compensation TFT T3 are turned on in response to the scan signal Sn at a low level. Here, the driving TFT T1 is diode-connected due to the turned on compensation TFT T3, and is biased in a forward direction.

Then, a compensation voltage Dm−Vth, which is obtained by subtracting a threshold Vth of the driving TFT T1 from the data signal Dm that is supplied from the data line 32, is applied to the gate G1 of the driving TFT T1.

The driving voltage ELVDD and the compensation voltage Dm−Vth are applied to terminals of the storage capacitor Cst, respectively, and charge that corresponds to a voltage difference (i.e., ELVDD−Dm+Vth) between the terminals is stored in the storage capacitor Cst. Afterward, the emission control signal En that is supplied from the emission control line 16 is changed from a high level to a low level during an emission period. Then, the operation control TFT T5 and the emission control TFT T6 are turned on in response to the emission control signal En at a low level during the emission period.

Then, the driving current Id is generated due to the voltage difference between the voltage of the gate G1 of the driving TFT T1 and the driving voltage ELVDD, and then is supplied to the OLED via the emission control TFT T6. A gate-source voltage Vgs of the driving TFT T1 is maintained at a level of 'ELVDD−Dm+Vth' due to the storage capacitor Cst level during the emission period, and according to a current-voltage relation of the driving TFT T1, the driving current Id is proportional to a square value ((ELVDD−Dm)2) of a value that is obtained by subtracting the threshold voltage Vth from the gate-source voltage Vgs. Thus, the driving current Id is determined regardless of the threshold voltage Vth of the driving TFT T1.

The first TFT TFTa of FIG. 1 may correspond to the driving TFT T1 of FIG. 4, and the second TFT TFTb of FIG. 1 may correspond to one of the other TFTs T2 through T6. For example, the second TFT TFTb of FIG. 1 may be the switching TFT T2.

Hereinafter, a structure of the pixel of the organic light-emitting display device shown in FIG. 4 will be described in detail with reference to FIGS. 5 and 6. Here, it is assumed that the driving TFT T1 has a structure of the first TFT TFTa of FIG. 1.

Figure 5:
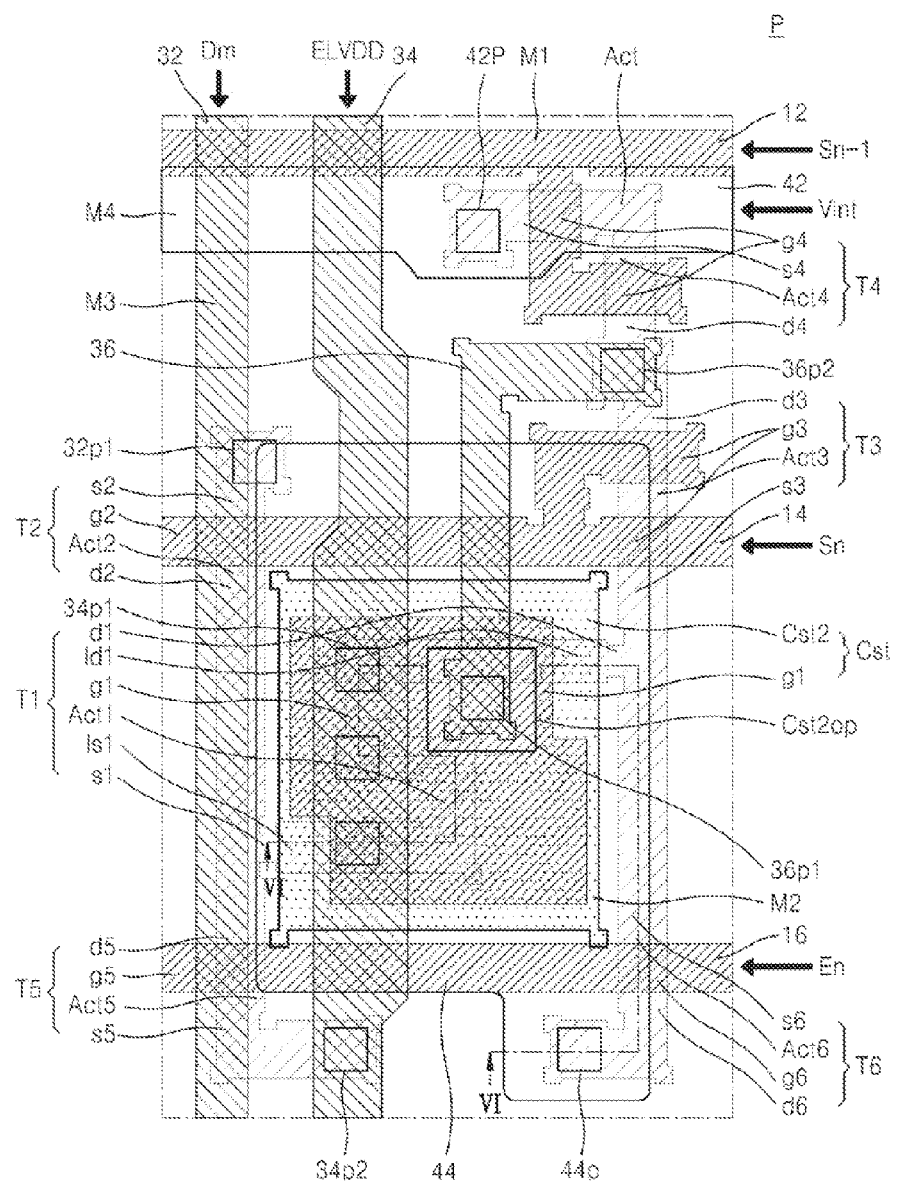
FIG. 5 is a plane view illustrating a pixel of the organic light-emitting display device shown in FIG. 4.

FIG. 5 is a plane view illustrating a pixel P of the organic light-emitting display device shown in FIG. 4.

Referring to FIG. 5, the pixel P of the organic light-emitting display device includes a driving TFT T1, a switching TFT T2, a compensation TFT T3, an initialization TFT T4, an operation control TFT T5, an emission control TFT T6, a storage capacitor Cst, and an OLED.

The pixel P includes a scan line 14, a previous scan line 12, an emission control line 16, an initialization voltage line 42, a data line 32, and a driving voltage line 34 to which a scan signal Sn, a previous scan signal Sn−1, an emission control signal En, an initialization voltage Vint, a data signal Dm, and a driving voltage ELVDD are applied, respectively. The scan line 14, the previous scan line 12, the emission control line 16, and the initialization voltage line 42 extend in a row direction, and the data line 32 and the driving voltage line 34 extend in a column direction.

The pixel P may include a semiconductor layer Act, a first conductive layer M1, a second conductive layer M2, a third conductive layer M3, and a fourth conductive layer M4. Although not illustrated in FIG. 5, an insulating layer may be interposed between each of the semiconductor layer Act, the first conductive layer M1, the second conductive layer M2, the third conductive layer M3, and the fourth conductive layer M4. Also, the pixel P may further include an intermediate layer (not shown) including an emission layer (EML), and a common electrode layer (not shown).

The semiconductor layer Act includes active patterns Act1 through Act6 of the driving TFT T1, the switching TFT T2, the compensation TFT T3, the initialization TFT T4, the operation control TFT T5, and the emission control TFT T6, respectively. The driving TFT T1, the switching TFT T2, the compensation TFT T3, the initialization TFT T4, the operation control TFT T5, and the emission control TFT T6 may be disposed along the semiconductor layer Act.

Referring to FIG. 5, the semiconductor layer Act is formed as one pattern in the pixel P. However, according to a design, the semiconductor layer Act may be formed as at least two separated patterns. The semiconductor layer Act may have various forms according to designs, and may include bent portions as shown in FIG. 5.

The first conductive layer M1 may include the previous scan line 12, the scan line 14, and the emission control line 16. Also, the first conductive layer M1 may include gate electrodes g1 through g6 of the driving TFT T1, the switching TFT T2, the compensation TFT T3, the initialization TFT T4, the operation control TFT T5, and the emission control TFT T6, respectively.

The second conductive layer M2 may include an upper electrode Cst2 of the capacitor Cst. The third conductive layer M3 may include the data line 32, the driving voltage line 34, and a connection line 36. The fourth conductive layer M4 may include the initialization voltage line 42 and a pixel electrode 44.

The semiconductor layer Act may be formed of polysilicon and may include a channel region that is not doped with impurities, and a source region and a drain region that are doped with impurities at sides of the channel region. Also, a driving active pattern Act1 of the driving TFT T1 may include not only a channel region, a source region s1, and a drain region d1 but may also include a low-density source region ls1 between the channel region and the source region s1, and a low-density drain region ld1 between the channel region and the drain region d1.

Here, impurities may vary according to types of a TFT and may be n-type impurities or p-type impurities. The semiconductor layer Act may include the driving active pattern Act1 of the driving TFT T1, a switching active pattern Act2 of the switching TFT T2, a compensation active pattern Act3 of the compensation TFT T3, an initialization active pattern Act4 of the initialization TFT T4, an operation control active pattern Act5 of the operation control TFT T5, and an emission control active pattern Act6 of the emission control TFT T6.

The driving TFT T1 includes the driving active pattern Act1 and a driving gate electrode g1. The driving active pattern Act1 may include a channel region that overlaps with the driving gate electrode g1, the source and drain regions s1 and d1, the low-density source region ls1 between the channel region and the source region s1, and the low-density drain region ld1 between the channel region and the drain region d1. The driving gate electrode g1 does not overlap with the low-density source region ls1 and the low-density drain region ld1. The low-density source region ls1 and the low-density drain region ld1 overlap with the upper electrode Cst2 of the capacitor Cst. The source and drain regions s1 and d1 do not overlap with any of the driving gate electrode g1 and the upper electrode Cst2. The driving active pattern Act1 is bent.

The upper electrode Cst2 is disposed on the driving gate electrode g1. The upper electrode Cst2 includes an opening Cst2op through which a contact plug 36p1 that is connected between the driving gate electrode g1 and the connection line 36 passes. Referring to FIG. 5, a shape of the opening Cst2op is rectangular but the shape of the opening Cst2op is not limited thereto. The upper electrode Cst2 may maximally overlap with the driving gate electrode g1 except for the opening Cst2op, and by doing so, a maximal capacitance may be achieved. As described above, the upper electrode Cst2 covers the low-density source region ls1 and the low-density drain region ld1.

The upper electrode Cst2 and the driving gate electrode g1 may configure a capacitor Cst. The driving gate electrode g1 also functions as a lower electrode of the capacitor Cst.

The upper electrode Cst2 may be connected to the driving voltage line 34 via contact plugs 34p1.

The switching TFT T2 includes the switching active pattern Act2 and a switching gate electrode g2 that is a portion of the scan line 14. The switching active pattern Act2 includes a channel region that overlaps with the switching gate electrode g2, and a source region s2 and a drain region d2 at sides of the channel region. The source region s2 may be connected to the data line 32 via a contact plug 34p1. The drain region d2 is connected to the source region s1 of the driving TFT T1 along the semiconductor layer Act.

The compensation TFT T3 includes the compensation active pattern Act3 and a compensation gate electrode g3 that is a portion of the scan line 14. The compensation active pattern Act3 includes a channel region that overlaps with the compensation gate electrode g3, and a source region s3 and a drain region d3 that are at sides of the channel region. The source region s3 is connected to the drain region d1 of the driving TFT T1 along the semiconductor layer Act. The drain region d3 may be connected to the connection line 36 via a contact plug 36$p$2. That is, the drain region d3 of the compensation TFT T3 is electrically connected to the driving gate electrode g1 via the connection line 36. As illustrated in FIG. 5, the compensation gate electrode g3 is formed as separate dual gate electrodes, so that leakage current may be prevented.

The initialization TFT T4 may include the initialization active pattern Act4 and an initialization gate electrode g4 that is a portion of the previous scan line 12. The initialization active pattern Act4 includes a channel region that overlaps with the initialization gate electrode g4, and a source region s4 and a drain region d4 that are at sides of the channel region. The source region s4 is connected to the initialization voltage line 42 via a contact plug 42$p$. Although not illustrated, the contact plug 42$p$ may include a connection member that is formed of the third conductive layer M3, a contact plug that connects the connection member and the source region s4, and a contact plug that connects the connection member and the initialization voltage line 42. The drain region d4 is connected to the connection line 36 via the contact plug 36$p$2. As illustrated in FIG. 5, the initialization gate electrode g4 may be formed as separate dual gate electrodes.

The operation control TFT T5 includes the operation control active pattern Act5 and an operation control gate electrode g5 that is a portion of the emission control line 16. The operation control active pattern Act5 includes a channel region that overlaps with the operation control gate electrode g5, and a source region s5 and a drain region d5 that are at sides of the channel region. The drain region d5 is connected to the source region S1 of the driving TFT T1 along the semiconductor layer Act. The source region s5 is connected to the driving voltage line 34 via a contact plug 34$p$2.

The emission control TFT T6 includes the emission control active pattern Act6 and an emission control gate electrode g6 that is a portion of the emission control line 16. The emission control active pattern Act6 includes a channel region that overlaps with the emission control gate electrode g6, and a source region s6 and a drain region d6 that are at sides of the channel region. The source region s6 is connected to the drain electrode D1 of the driving TFT T1 along the semiconductor layer Act. The drain region d6 is connected to the pixel electrode 44 via a contact plug 44$p$. Although not illustrated, the contact plug 44$p$ may include a connection member that is formed of the third conductive layer M3, a contact plug that connects the connection member and the drain region d6, and a contact plug that connects the connection member and the pixel electrode 44.

The pixel electrode 44 may be disposed on the upper electrode Cst2 and may apply current to the intermediate layer that includes the EML and that is disposed thereon. The current that is applied to the intermediate layer is transmitted to a common electrode (not shown) on the intermediate layer.

The circuit diagram of FIG. 4 and the plane view of FIG. 5 may vary according to designs.

Figure 6:
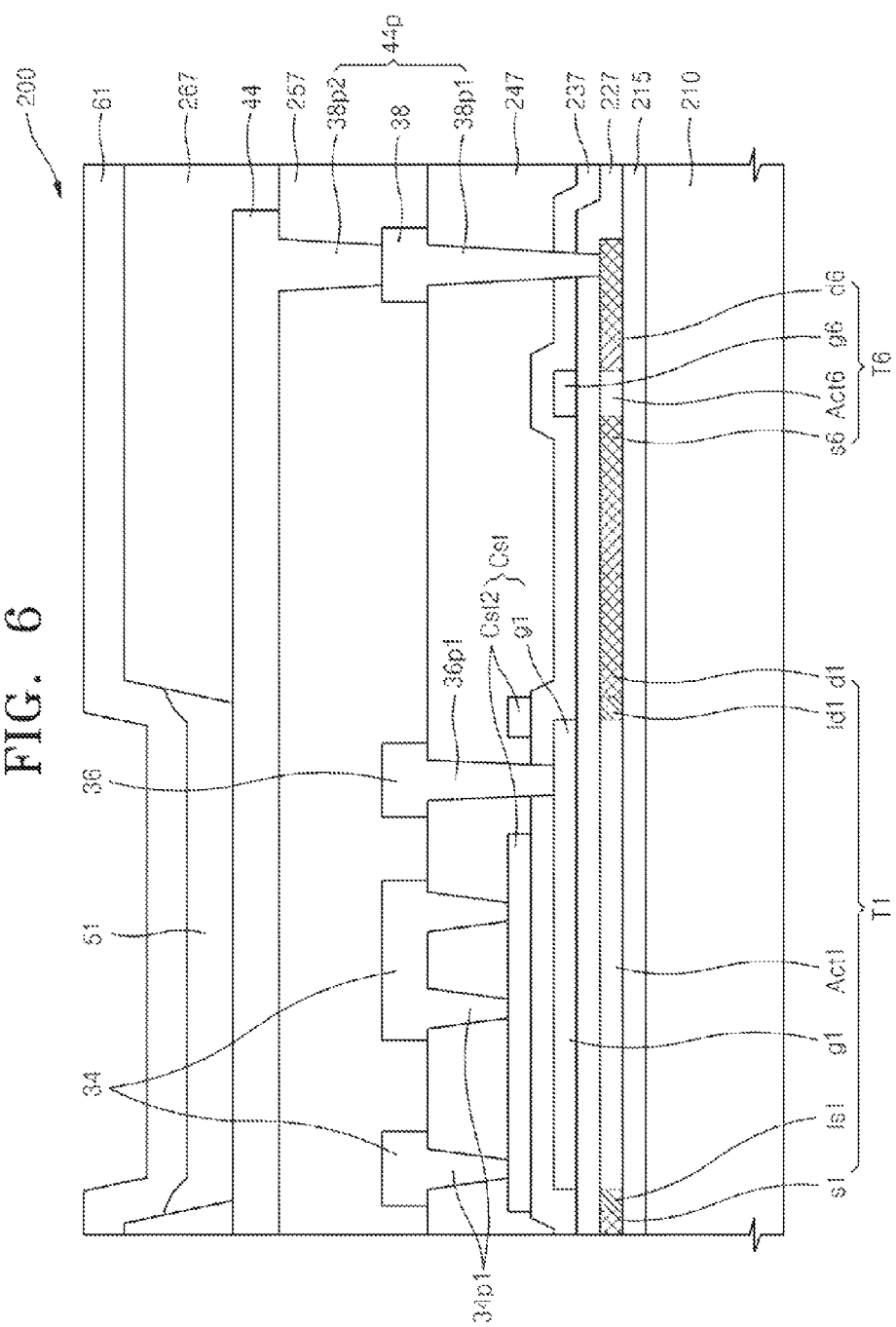
FIG. 6 is a cross-sectional view illustrating the organic light-emitting display device of FIG. 5, taken along line VI-VI.

FIG. 6 is a cross-sectional view illustrating the organic light-emitting display device of FIG. 5, taken along line VI-VI.

Referring to FIG. 6, the organic light-emitting display device (hereinafter, an organic light-emitting display device 200) includes the driving TFT T1, the storage capacitor Cst, the emission control TFT T6, the pixel electrode 44, an intermediate layer 51, and a common electrode 61.

The driving TFT T1 and the emission control TFT T6 are disposed on a substrate 210. A buffer layer 215 may be disposed on the substrate 210. The upper electrode Cst2 is disposed on the driving TFT T1, and the driving gate electrode g1 and the upper electrode Cst2 configure the storage capacitor Cst. A lower gate insulating layer 227 is interposed between the driving active pattern Act1 and the driving gate electrode g1 and between the emission control active pattern Act6 and the emission control gate electrode g6, and an upper gate insulating layer 237 is interposed between the driving gate electrode g1 and the upper electrode Cst2. The driving TFT T1, the storage capacitor Cst, and the emission control TFT T6 are covered by an interlayer insulating layer 247.

The driving TFT T1 may correspond to the first TFT TFTa of FIG. 1, and the emission control TFT T6 may correspond to the second TFT TFTb of FIG. 1. The storage capacitor Cst corresponds to the capacitor Cst of FIG. 1. The lower gate insulating layer 227, the upper gate insulating layer 237, and the interlayer insulating layer 247 correspond to the lower gate insulating layer 127, the upper gate insulating layer 137, and the interlayer insulating layer 147 of FIG. 1, respectively. Since the driving TFT T1, the storage capacitor Cst, the emission control TFT T6, the lower gate insulating layer 227, the upper gate insulating layer 237, and the interlayer insulating layer 247 are described above with reference to FIG. 1, the detailed descriptions thereof are omitted here.

The driving voltage line 34, the connection line 36, and a connection member 38 are disposed above the upper gate insulating layer 237. The upper electrode Cst2 is connected to the driving voltage line 34 via contact plugs 34$p$1. A total number of the contact plugs 34$p$1 may vary.

The driving gate electrode g1 is connected to the connection line 36 via a contact plug 36$p$1. Also, the drain region d6 of the emission control TFT T6 is connected to the connection member 38 via a contact plug 38$p$1 that penetrates through all of the lower gate insulating layer 227, the upper gate insulating layer 237, and the interlayer insulating layer 247.

A planarization layer 257 is disposed to cover the driving voltage line 34, the connection line 36, and the connection member 38 above the upper gate insulating layer 237. The planarization layer 257 may be formed of an inorganic insulating material including oxide, nitride, and/or oxynitride or may be formed of an organic insulating material.

The pixel electrode 44 is disposed on the planarization layer 257. The pixel electrode 44 is connected to the connection member 38 via a contact plug 38$p$2 that penetrates through the planarization layer 257. The contact plug 44$p$ of FIG. 5 indicates a concept including the contact plug 38$p$1 that is connected between the drain region d6 and the pixel electrode 44, the connection member 38, and the contact plug 38$p$2.

The pixel electrode 44 may be a transparent electrode or a reflective electrode. When the pixel electrode 44 is formed as a transparent electrode, the pixel electrode 44 may include ITO, IZO, ZnO, or In2O3. Also, when the pixel electrode 44 is formed as a reflective electrode, the pixel electrode 44 may have a multi-stack structure including a first layer that is formed of Ag, Mg, Al, Pt, Pd, Au, Ni, Nd, Ir, Cr, or compound of any of these, and a second layer that is formed on the first layer and that includes ITO, IZO, ZnO, or In2O3.

A pixel-defining layer (PDL) 267 that defines a pixel by exposing a portion of the pixel electrode 44 may be disposed on the planarization layer 257. The intermediate layer 51, including an EML, may be formed on the portion the pixel electrode 44 that is exposed through PDL 267.

The common electrode 61 may be stacked on an entire surface of the substrate 210. Here, the common electrode 61 may be formed as a transparent electrode or a reflective electrode. When the common electrode 61 is formed as a transparent electrode, the common electrode 61 may include a first layer that is formed of Li, Ca, LiF/Ca, LiF/Al, Al, Mg, or a compound of any of these, and a second layer that is formed on the first layer and that includes ITO, IZO, ZnO, or In2O3. Here, the second layer may be formed as an auxiliary electrode or a bus electrode line. When the common electrode 61 is formed as a reflective electrode, the aforementioned Li, Ca, LiF/Ca, LiF/Al, Al, Mg, or a compound of any of these is completely deposited.

The intermediate layer 51 that is interposed between the pixel electrode 44 and the common electrode 61 may include a small molecule organic material or a polymer organic material.

When the intermediate layer 51 includes a small molecule organic material, the intermediate layer 51 may have a structure in which a hole injection layer (HIL), a hole transport layer (HTL), an EML, an electron transport layer (ETL), and an electron injection layer (EIL) are singularly or multiply stacked.

Also, the intermediate layer 51 may be formed of various organic materials including copper phthalocyanine (CuPc), N,N'-Di(naphthalene-1-yl)-N,N'-diphenyl-benzidine (NPB), tris-8-hydroxyquinoline aluminum)(Alq3), or the like, by a vacuum deposition method using masks.

When the intermediate layer 51 includes a polymer organic material, the intermediate layer 51 may have a structure of an HTL and an EML, and in this regard, the HTL may be formed of poly(3,4-ethylenedioxythiophene) (PEDOT), and the EML may be formed of a poly-phenylenevinylene (PPV)-based material or a polyfluorene-based material.

The EML may emit light in a color selected from a red color, a green color, and a blue color. In another embodiment, the EML may emit white light, and the organic light-emitting display device 200 may further include a color filter layer of a red color, a green color, and a blue color so as to output images with various colors.

Although not illustrated, an encapsulation layer (not shown) may be formed on the common electrode 61. The encapsulation layer may have a structure in which a plurality of inorganic layers are stacked or an inorganic layer and an inorganic layer are alternatively stacked.

In another embodiment, an encapsulation substrate (not shown) may be disposed on the common electrode 61. The substrate 210 may be encapsulated by the encapsulation substrate.

According to the one or more embodiments of the present invention, a lightly doped region is interposed between a channel region and a heavily doped region of a thin film transistor (TFT), so that a strength of an electric field that is formed between the channel region and the heavily doped region may be decreased. Thus, it is possible to prevent leakage current due to a short channel effect or a hot electron effect which is caused by a strong electric field. Also, it is not required to use an additional mask so as to form the lightly doped region, so that manufacturing costs are not increased.

Also, since the lightly doped region may be included, without a burden of additional costs, in a driving transistor that is driven by using relatively large current in an organic light-emitting display device, the organic light-emitting display device may operate more stably.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A thin film semiconductor device, comprising:
   a substrate;
   a first active pattern disposed on the substrate, the first active pattern comprising a channel region, a lightly doped region, and a heavily doped region;
   a first lower conductive pattern disposed on the first active pattern and covering the channel region, the first active pattern and the first lower conductive pattern configuring a first thin film transistor, the first lower conductive pattern functioning as a gate electrode of the first thin film transistor; and
   a first upper conductive pattern disposed on the first lower conductive pattern and covering the channel region and the lightly doped region, a sidewall edge of the first upper conductive pattern being flush with an interface between the lightly doped region and the heavily doped region.

2. The thin film semiconductor device of claim 1, wherein a sidewall edge of the first lower conductive pattern is flush with an interface between the channel region and the lightly doped region.

3. The thin film semiconductor device of claim 1, wherein the first lower conductive pattern and the first upper conductive pattern configure a capacitor.

4. The thin film semiconductor device of claim 1, further comprising:
   a lower gate insulating layer between the first active pattern and the first lower conductive pattern; and
   an upper gate insulating layer between the first lower conductive pattern and the first upper conductive pattern.

5. The thin film semiconductor device of claim 1, wherein the heavily doped region comprises a first heavily doped region and a second heavily doped region, the channel region being disposed between the first heavily doped region and the second heavily doped region, and
   the lightly doped region comprises a first lightly doped region disposed between the channel region and the first heavily doped region, and a second lightly doped region disposed between the channel region and the second heavily doped region.

6. The thin film semiconductor device of claim 1, further comprising:
   a second active pattern formed at the same layer as the first active pattern, the second active pattern comprising a source region, a drain region, and a channel region disposed between the source region and the drain region; and
   a second lower conductive pattern formed at the same layer as the first lower conductive pattern and covering the channel region of the second active pattern, wherein the second active pattern and the second lower conductive pattern configure a second TFT, and the second lower conductive pattern functions as a gate electrode of the second TFT.

7. The thin film semiconductor device of claim 6, wherein the second active pattern further comprises a lightly doped region disposed between the channel region and one of the source region and the drain region, and
   the thin film semiconductor device further comprises a second upper conductive pattern formed at the same layer as the first upper conductive pattern and covering the channel region and the lightly doped region of the second active pattern.

8. The thin film semiconductor device of claim 7, wherein the second upper conductive pattern is electrically connected to the second lower conductive pattern and thus functions as a common gate electrode of the second TFT.

9. The thin film semiconductor device of claim 7, wherein the second upper conductive pattern floats.

10. An organic light-emitting display device, comprising:
a substrate;
a plurality of thin film transistors (TFTs) and a capacitor disposed on the substrate;
a pixel electrode electrically connected to one of the plurality of TFTs;
a common electrode disposed on the pixel electrode; and
an intermediate layer disposed between the pixel electrode and the common electrode, the intermediate layer comprising an emission layer (EML), the plurality of TFTs including a first TFT which comprises:
a first active pattern comprising a channel region, a lightly doped region, and a heavily doped region; and
a first lower conductive pattern disposed on the first active pattern and covering the channel region, the first lower conductive pattern functioning as a gate electrode of the first TFT, the capacitor comprising the first lower conductive pattern and a first upper conductive pattern disposed on the first lower conductive pattern, the first upper conductive pattern covering the channel region and the lightly doped region, a sidewall edge of the first upper conductive pattern being flush with an interface between the lightly doped region and the heavily doped region.

11. The organic light-emitting display device of claim 10, wherein a sidewall edge of the first lower conductive pattern is flush with an interface between the channel region and the lightly doped region.

12. The organic light-emitting display device of claim 10, wherein the first lower conductive pattern functions as a lower electrode of the capacitor.

13. The organic light-emitting display device of claim 10, wherein the heavily doped region comprises a source region and a drain region which are respectively disposed at opposite sides of the channel region, and
the lightly doped region comprises a low-density source region between the channel region and the source region, and a low-density drain region between the channel region and the drain region.

14. The organic light-emitting display device of claim 10, wherein the first TFT is a driving TFT that supplies driving current to the EML.

15. The organic light-emitting display device of claim 10, wherein the plurality of TFTs further comprises a second TFT which comprises a second active pattern that is formed at the same layer as the first active pattern, wherein the second active pattern comprises a source region, a drain region, and a channel region disposed between the source region and the drain region, and a second lower conductive pattern, and wherein the second lower conductive pattern is formed at the same layer as the first lower conductive pattern, covers the channel region of the second active pattern, and functions as a gate electrode of the second TFT.

16. The organic light-emitting display device of claim 15, wherein the second active pattern further comprises a lightly doped region disposed between the channel region and one of the source region and the drain region of the second TFT, and
the organic light-emitting display device further comprises a second upper conductive pattern formed at the same layer as the first upper conductive pattern and covering the channel region and the lightly doped region of the second active pattern.

17. A method of manufacturing a thin film semiconductor device, the method comprising:
forming an active pattern on a substrate;
forming a lower conductive pattern on the active pattern;
lightly injecting impurities into the active pattern by using the lower conductive pattern as a doping mask;
forming an upper conductive pattern on the lower conductive pattern; and
heavily injecting impurities into the active pattern by using the lower conductive pattern and the upper conductive pattern as doping masks, and forming the active pattern comprising a channel region, a lightly doped region, and a heavily doped region, the thin film semiconductor device comprising:
the substrate;
the active pattern disposed on the substrate;
the lower conductive pattern disposed on the active pattern and covering the channel region, the active pattern and the lower conductive pattern configuring a thin film transistor, the lower conductive pattern functioning as a gate electrode of the thin film transistor; and
the upper conductive pattern disposed on the lower conductive pattern and covering the channel region and the lightly doped region, a sidewall edge of the upper conductive pattern being flush with an interface between the lightly doped region and the heavily doped region.

18. The method of claim 17, wherein
the lower conductive pattern covers the channel region and does not cover the lightly doped region and the heavily doped region, and
the upper conductive pattern covers the channel region and the lightly doped region, and does not cover the heavily doped region.

19. The method of claim 17, wherein
the forming of the lower conductive pattern comprises forming a lower gate insulating layer on the active pattern, and forming the lower conductive pattern on the lower gate insulating layer, and
the forming of the upper conductive pattern comprises forming an upper gate insulating layer on the lower conductive pattern, and forming the upper conductive pattern on the upper gate insulating layer.

20. The method of claim 17, wherein the lower conductive pattern and the upper conductive pattern configure a capacitor, and the lower conductive pattern functions as a lower electrode of the capacitor.

* * * * *